(12) United States Patent
Mutnury et al.

(10) Patent No.: US 12,401,107 B2
(45) Date of Patent: *Aug. 26, 2025

(54) SYSTEM FOR CROSSTALK REJECTING TOPOLOGY

(71) Applicant: Dell Products L.P., Round Rock, TX (US)

(72) Inventors: Bhyrav Mutnury, Round Rock, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/774,211

(22) Filed: Jul. 16, 2024

(65) Prior Publication Data

US 2024/0372239 A1 Nov. 7, 2024

Related U.S. Application Data

(63) Continuation of application No. 17/514,011, filed on Oct. 29, 2021.

(51) Int. Cl.
*H01P 1/20* (2006.01)
*H01P 11/00* (2006.01)

(52) U.S. Cl.
CPC ............. *H01P 1/20* (2013.01); *H01P 11/007* (2013.01)

(58) Field of Classification Search
CPC ....... H01P 1/20; H01P 11/007; H05K 1/0231; H05K 1/162; H05K 2201/09236; H05K 2201/09245; H05K 1/0228

See application file for complete search history.

(56) References Cited

U.S. PATENT DOCUMENTS 9,893,761 B2 * 2/2018 Ye ..................... H05K 1/0216

* cited by examiner

*Primary Examiner* — Andrea Lindgren Baltzell
*Assistant Examiner* — Kimberly E Glenn
(74) *Attorney, Agent, or Firm* — McDermott Will & Schulte LLP (57) ABSTRACT

A system for preventing crosstalk between adjacent channels comprises a crossover connector positioned along a length of one channel such that a portion of a positive trace for a first channel is positioned adjacent to a positive trace of a positive trace of an adjacent channel. The position of the crossover connector is based on preventing crosstalk and crossover connectors on adjacent channels may be staggered to further prevent crosstalk. A crossover connector may be based on capacitors or resistors to prevent crosstalk.

3 Claims, 13 Drawing Sheets

SYSTEM FOR CROSSTALK REJECTING TOPOLOGY

BACKGROUND

Field of the Disclosure

This disclosure relates generally to information handling systems and, more particularly, to systems for crosstalk rejecting communication.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

High performance servers implement high speed channels using differential pair routing. As processing and communication speeds increase, crosstalk along long adjacent traces is becoming more common.

SUMMARY

Embodiments disclosed herein may be generally directed to systems for preventing crosstalk between adjacent channels in high performance information handling systems.

Embodiments may be generally directed to a system comprising a first channel formed with a first positive trace having a first positive trace length, a first negative trace having a first negative trace length, and a capacitor positioned at a first location along the first positive trace length, wherein the first positive trace is on a first side of the first negative trace. The system further comprises a second channel having a second channel length. The second channel comprises a second positive trace comprising a first positive trace portion having a first positive trace portion length and a second positive trace portion having a second positive trace portion length, a second negative trace comprising a first negative trace portion having a first negative trace portion length and a second negative trace portion having a second negative trace portion length, and a crossover connector comprising a positive trace crossover capacitor or resistor and a negative trace crossover capacitor or resistor.

The first positive trace portion of the second positive trace is on the first side of the first negative trace portion of the second negative trace and is coupled to a first positive trace post of the crossover connector, wherein the first negative trace portion of the second negative trace is coupled to a first negative trace post of the crossover connector. The second positive trace portion of the second positive trace is on the second side of the second negative trace portion of the second negative trace and is coupled to a second positive trace post in the crossover connector, wherein the second negative trace portion of the second negative trace is coupled to a second negative trace post.

In some embodiments, the crossover connector is positioned a distance from a signal source such as a processor. In some embodiments, the crossover connector is positioned a distance less than half the length of the first positive trace length. In some embodiments, the crossover connector is located on a motherboard. In some embodiments, the crossover connector is located on a card.

In some embodiments, the crossover connector comprises a plurality of layers, wherein each layer comprises two positive post pads and two negative post pads, wherein at least one layer comprises a filament between the two positive pads, at least one layer comprises a filament between the two negative pads and at least one layer comprises does not have a filament between the two positive pads or the two negative pads.

In some embodiments, the crossover connector comprises a resistor. In some embodiments, the crossover connector comprises a capacitor.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Figure 1:
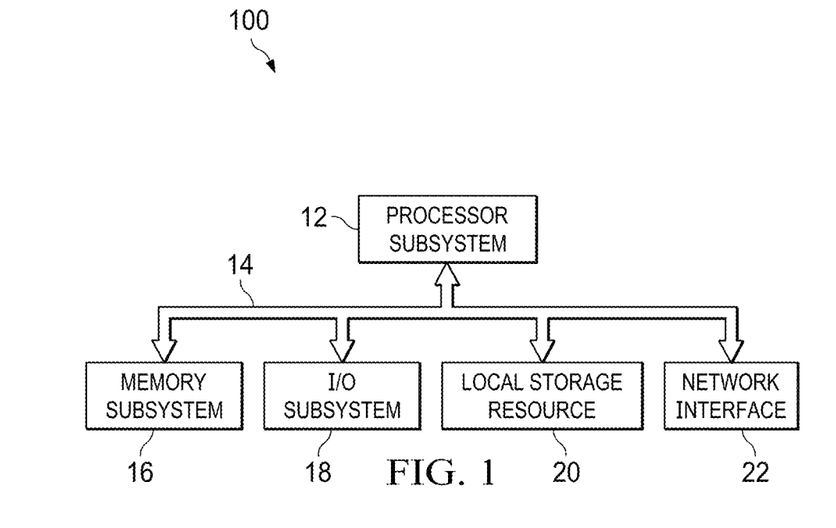
FIG. 1 is a block diagram of an information handling system.

Turning to the drawings, FIG. 1 illustrates a block diagram depicting selected elements of an embodiment of information handling system 100. It is noted that FIG. 1 is not drawn to scale but is a schematic illustration.

As shown in FIG. 1, components of information handling system 100 may include, but are not limited to, a processor subsystem 12, which may comprise one or more processors, and a system bus 14 that communicatively couples various system components to processor subsystem 12 including, for example, a memory subsystem 16, an I/O subsystem 18, local storage resource 20, and network interface 22.

Processor subsystem 12 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 12 may interpret and execute program instructions and process data stored locally (e.g., in memory subsystem 16). In the same or alternative embodiments, processor subsystem 12 may interpret and execute program instructions and process data stored remotely (e.g., in a network storage resource).

System bus 14 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 16 may comprise a system, device, or apparatus operable to retain and retrieve program instructions and data for a period of time (e.g., computer-readable media). Memory subsystem 16 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 18 may comprise a system, device, or apparatus generally operable to receive and transmit data to or from or within information handling system 100. I/O subsystem 18 may represent, for example, a variety of communication interfaces, graphics interfaces, video interfaces, user input interfaces, and peripheral interfaces. In various embodiments, I/O subsystem 18 may be used to support various peripheral devices, such as a touch panel, a display adapter, a keyboard, a touch pad, or a camera, among other examples. In some implementations, I/O subsystem 18 may support so-called 'plug and play' connectivity to external devices, in which the external devices may be added or removed while information handling system 100 is operating.

Local storage resource 20 may comprise computer-readable media (e.g., hard disk drive, floppy disk drive, CD-ROM, and other type of rotating storage media, flash memory, EEPROM, or another type of solid-state storage media) and may be generally operable to store instructions and data.

Network interface 22 may be a suitable system, apparatus, or device operable to serve as an interface between information handling system 100 and a network (not shown). Network interface 22 may enable information handling system 100 to communicate over a network using a suitable transmission protocol or standard. In some embodiments, network interface 22 may be communicatively coupled via a network to a network storage resource (not shown). A network coupled to network interface 22 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 22 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (ISCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof.

A network coupled to network interface 22 or various components associated therewith may be implemented using hardware, software, or any combination thereof.

Components described above may communicate with each other over channels, wherein each channel may comprise a pair of traces. One major challenge for information handling systems is lowering signal losses associated with the traces. For example, high performance servers implement high speed channels using differential pair routing. As speeds increase, the pair-to-pair isolation needs to increase to prevent crosstalk along long adjacent traces. However, any extra spacing reduces routing density and increases layer count and cost.

Embodiments disclosed herein may comprise pairs of traces with alternating polarity over some portion of their length to reduce crosstalk. Alternating polarity may be accomplished by staggering connectors of adjacent channels or implementing crossover connectors.

Figure 2:
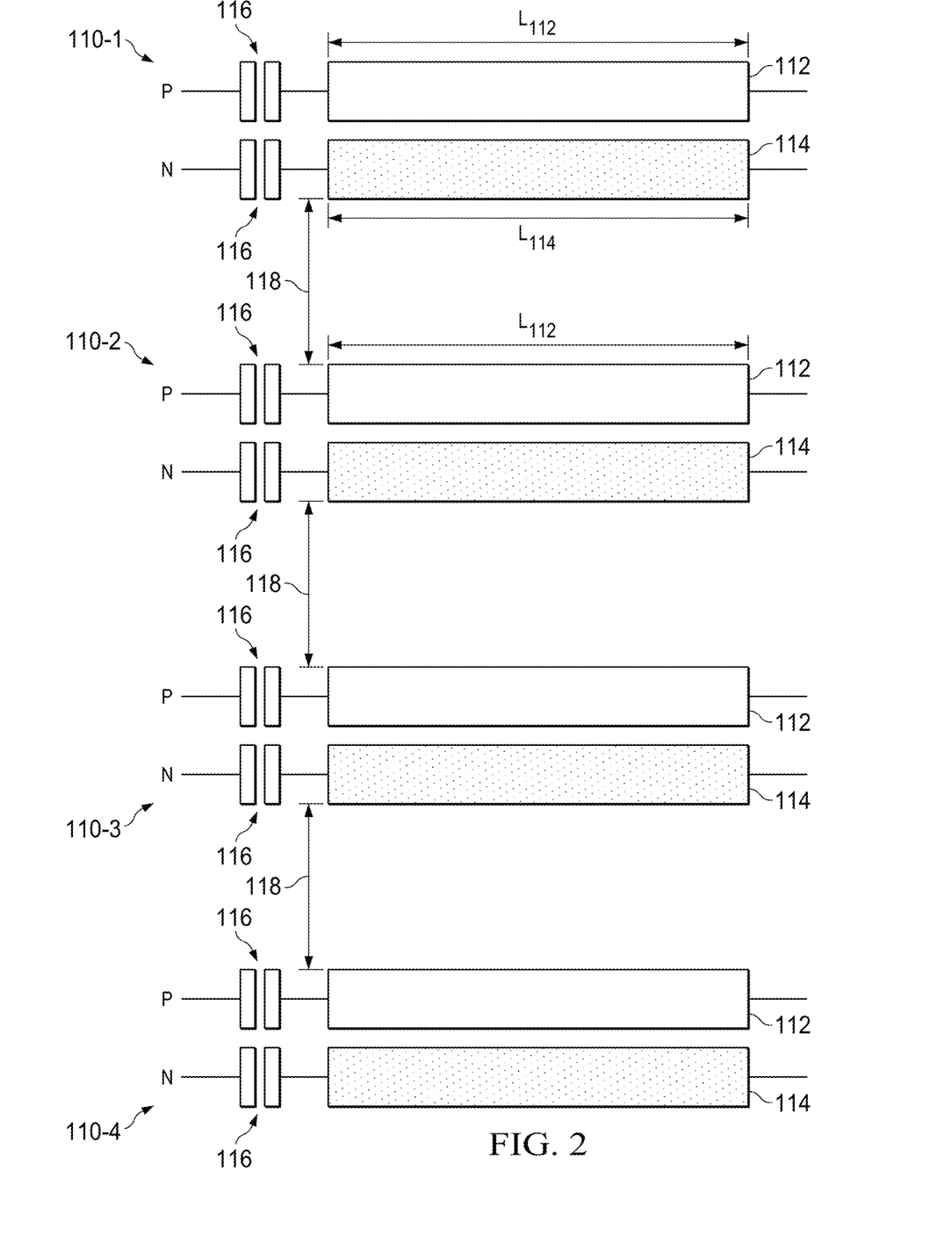
FIG. 2 depicts a layout of a plurality of pairs of traces, illustrating a situation in which crosstalk can occur between adjacent traces.

Referring to FIG. 2, information handling systems, such as high performance servers, implement high speed channels 10 using differential pair routing. As depicted in FIG. 2, a first channel 110-1 comprises a differential pair including positive trace 112 and negative trace 114. Each trace 112, 114 comprises connector 116 near the source (not shown). Each channel 110 (e.g., channel 110-1) is separated from an adjacent channel 110 (e.g., channel 110-2) by a distance 118-1. For information handling systems 100 operating at lower power or speeds, distance 118 may be small. However, as speeds increase, the pair-to-pair isolation needs to increase to prevent crosstalk along long adjacent traces. However, increasing the distance 118 between adjacent channels 110 may not be possible, since extra spacing reduces routing density and increases layer count and cost.

Embodiments disclosed herein may configure the traces of a channel to cross over each other along a length of the channel 110, whereby signals from adjacent channels 110 do not cross over and signal losses are reduced.

Particular embodiments are best understood by reference to FIGS. 3-8, 9A-9B and 10-11, wherein like numbers are used to indicate like and corresponding parts.

Figure 3:
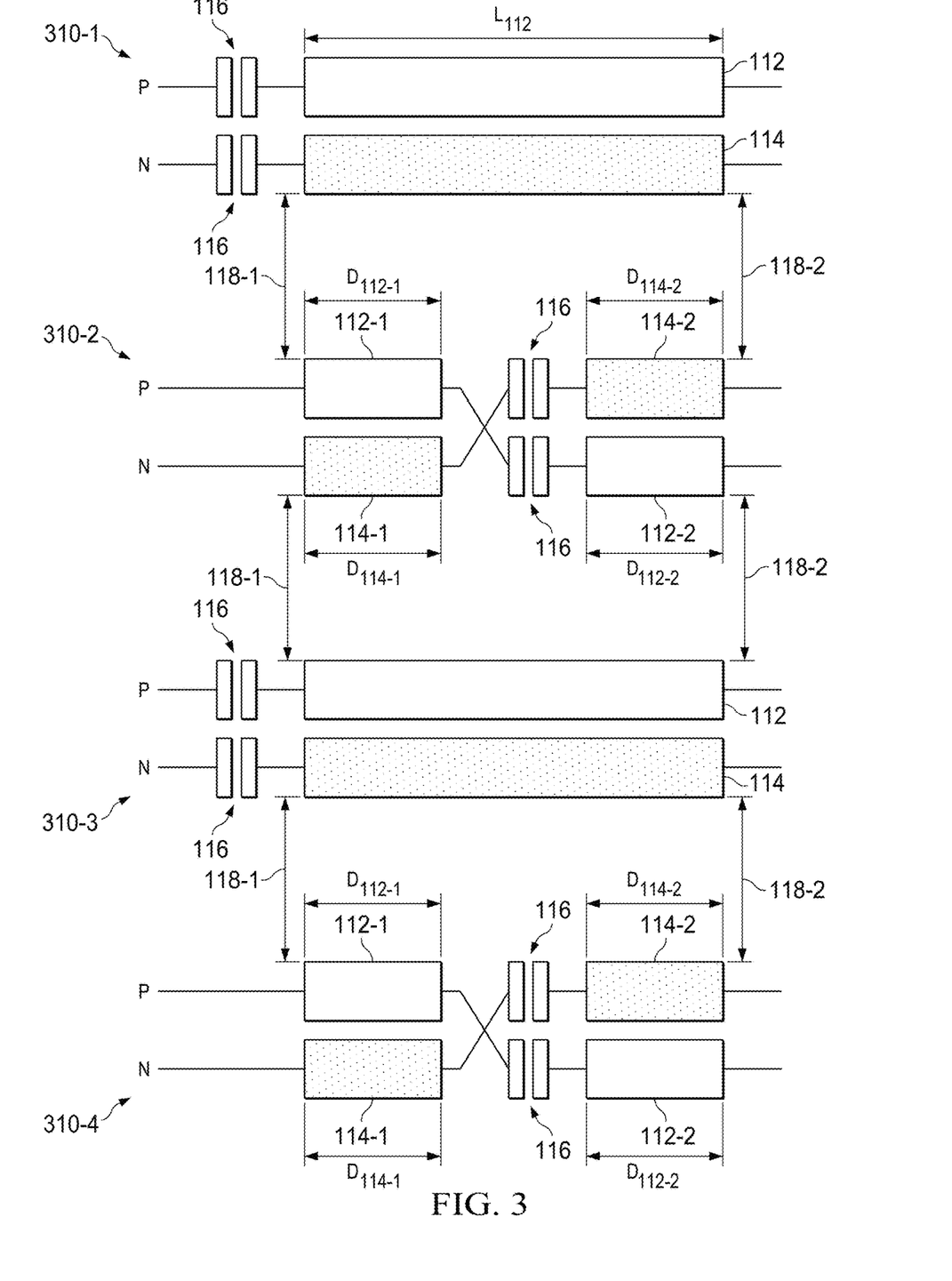
FIG. 3 depicts a layout of a plurality of channels according to one embodiment, illustrating a system for preventing crosstalk between adjacent traces.

Referring to FIG. 3, a system for preventing crosstalk between channels 310 having positive traces 112 and negative traces 114 may comprise a staggered connector configuration, wherein a first channel 310-1 has first connectors 116 at a first position between the ends of the first channel 310-1 and a second channel 310-2 has second connectors 116 at a second position between the ends of second channel 310-2, wherein the position of the second connectors 116 in second channel 310-2 is staggered relative to the position of the first connectors 116 in first channel 310-1. Each of connectors 116 may be capacitors or resistors.

Connectors 116 corresponding to first channel 310-1 may be positioned at either end such that positive trace 112 and negative trace 114 may each be a continuous trace over their respective lengths $L_{112}$ and $L_{114}$.

Staggered Position of Connectors in Other Channels

Second channel 310-2 may be formed with first portion 112-1 of positive trace 112 extending a distance $D_{112\text{-}1}$, second portion 112-2 extending a distance $D_{112\text{-}2}$, and crossover connector 116 positioned between first portion 112-1 and second portion 112-2 such that positive trace 112 is discontinuous. Connector 116 corresponding to positive trace 112 of second channel 310-2 may be positioned between first portion 112-1 and second portion 112-2 a distance $D_{112\text{-}1}$ along the length $L_{112}$ of positive trace 112 not near either end of second channel 310-2.

Second channel 310-2 may be formed with first portion 114-1 of negative trace 114 extending a distance $D_{114\text{-}1}$, second portion 114-2 extending a distance $D_{114\text{-}2}$, and crossover connector 116 positioned between first portion 114-1 and second portion 114-2 such that negative trace 14 is discontinuous. Connector 116 corresponding to negative trace 114 of second channel 310-2 may be positioned between first portion 114-1 and second portion 114-2 a distance $D_{114\text{-}1}$ along the length $L_{114}$ of negative trace 114 not near either end of second channel 310-2.

Crossover Connections

Still referring to channel 310-2 of FIG. 3, first portion 112-1 of positive trace 112 may be configured on a first side of first portion 114-1 of negative trace 114 and second portion 112-2 of positive trace 112 may be positioned on a second side of second portion 114-2 of negative trace 114. Thus, first portion 112-1 of positive trace 112 of second channel 310-2 may be positioned adjacent to negative trace 114 of first channel 310-1. However, second portion 112-2 of positive trace 112 of second channel 310-2 is positioned away from negative trace 114 of first channel 310-1, reducing the likelihood of crosstalk between positive trace 112 of second channel 310-2 and negative trace 114 of first channel 310-1.

In some embodiments, third channel 310-3 may be formed similar to first channel 310-1 because of the configuration of second channel 310-2 and fourth channel 310-4 may be formed similar to second channel 310-2 because of the configuration of third channel 310-3. In other embodiments (not shown), one or more of third channel 310-3 and fourth channel 310-4 may be formed with connectors 116 positioned staggered relative to adjacent channels 310 at any position along the length of the channel 310 between either end.

Figure 4:
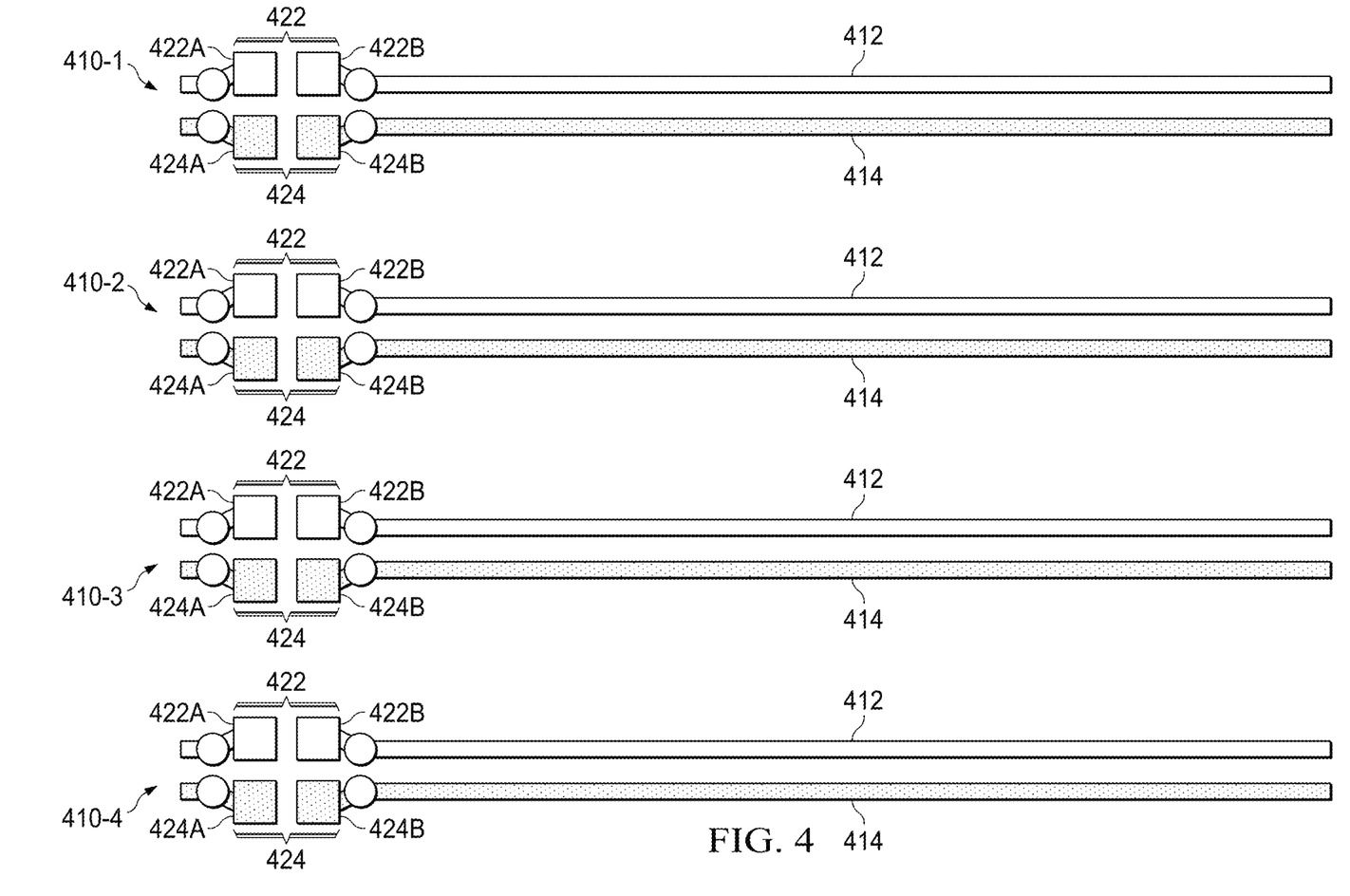
FIG. 4 depicts a layout of a plurality of channels with all caps near a source, illustrating a situation in which crosstalk can occur between adjacent traces.

FIG. 4 depicts a common implementation of channels 410 for communicating signals in information handling system 100. As depicted in FIG. 4, each channel 410 is configured with positive trace 412 with connector 422 comprising posts 422A and 422B, wherein post 422A may receive signals from a source and transmit the signals to post 422B for transmission along positive trace 412. Furthermore, each channel 410 is configured with negative trace 414 with connector 424 comprising posts 424A and 424B, wherein post 424A may receive signals from the source and transmit the signals to post 424B for transmission along negative trace 414. As power and processing speeds increase, crosstalk is likely to occur between negative trace 414 of channel 410-1 and positive trace 412 of channel 410-2, between negative trace 414 of channel 410-2 and positive trace 412 of channel 410-3 or negative trace 14 of channel 410-3 and positive trace 412 of channel 410-4. Connectors 422 and 424 may comprise capacitors or resistors.

Figure 5:
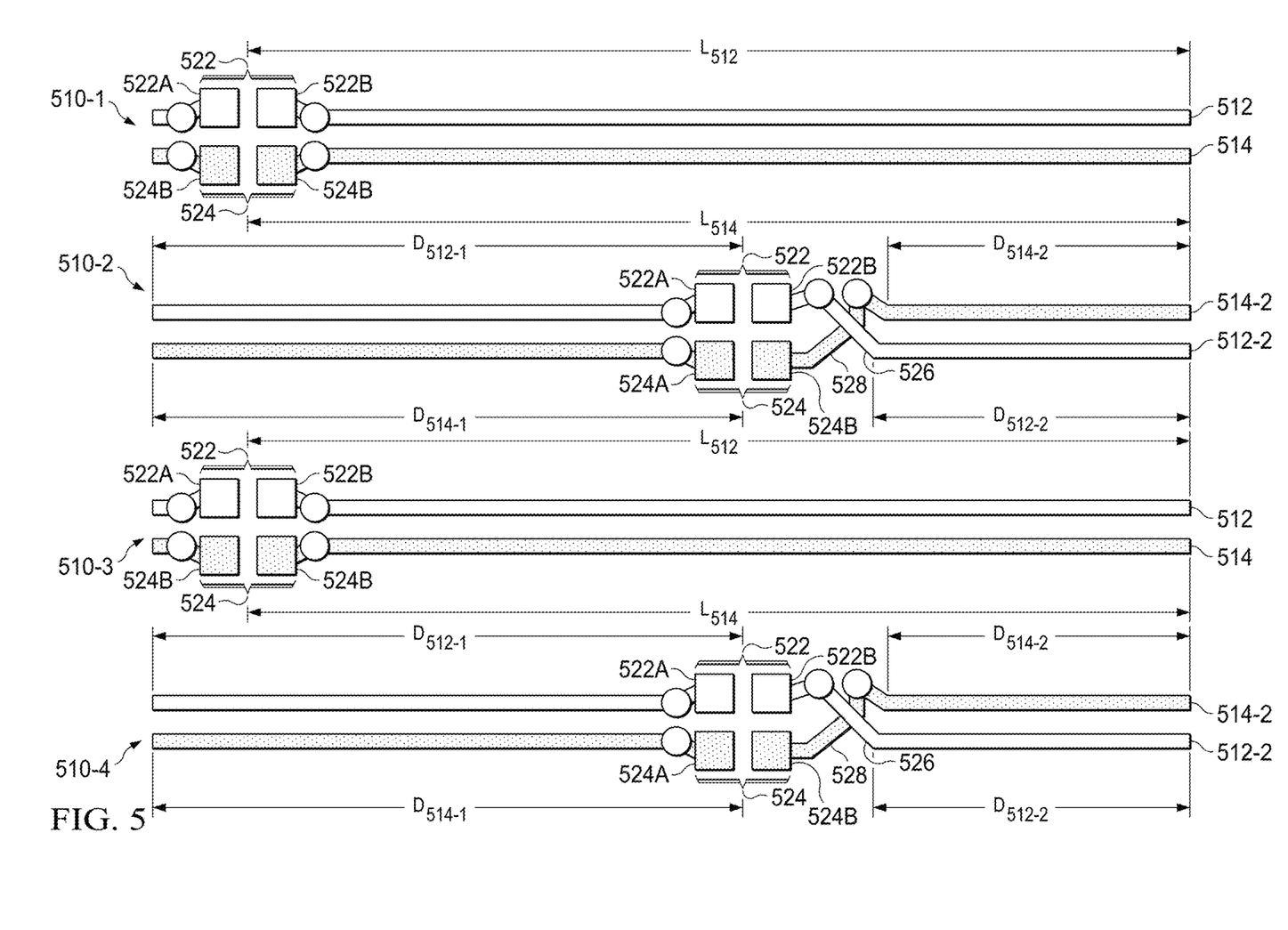
FIG. 5 depicts a layout of a plurality of channels according to one embodiment, illustrating a system for preventing crosstalk between adjacent traces using capacitors.

FIG. 5 depicts an embodiment of a system for preventing crosstalk between adjacent channels 510 in an information handling system 100. As depicted in FIG. 5, each connector 522 of first channel 510-1 and third channel 510-3 may be configured with connector posts 522A, 522B positioned at an end of positive trace 512 such that positive trace 512 is continuous over length $L_{512}$. Each connector 524 of first channel 510-1 and third channel 510-3 may also be configured with connector posts 524A, 524B positioned at an end of negative trace 514 such that negative trace 514 is continuous over length $L_{514}$.

Each of second channel 510-2 and fourth channel 510-4 may be configured with positive trace 512 comprising first portion 512-1, second portion 512-2 and connector 522 comprising posts 522A, 522B positioned between first portion 512-1 and second portion 512-2 a distance $D_{512-1}$ from the end of positive trace 512 such that a second portion 512-2 of positive trace 512 is located on an opposite side of negative trace 514 and positive trace 512 is discontinuous over length $L_{512}$. Each of second channel 510-2 and fourth channel 510-4 may also be configured with negative trace 514 comprising first portion 514-1, second portion 514-2 and connector 524 comprising posts 524A, 524B positioned a distance $D_{514-1}$ from the end of negative trace 514 such that negative trace 514 is discontinuous over length $L_{514}$.

Crossover Connection Based on Breakout Pattern

Still referring to FIG. 5, first portion 512-1 of positive trace 512 may be configured on a first side of first portion 514-1 of negative trace 514 and second portion 512-2 of positive trace 512 may be positioned on a second side of negative portion 514-2. Thus, first portion 512-1 of positive trace 512 of second channel 510-2 may be positioned adjacent to negative trace 514 of first channel 510-1. However, second portion 512-2 of positive trace 512 of second channel 510-2 is positioned away from negative trace 514 of first channel 510-1, reducing the likelihood of crosstalk between positive trace 512 of second channel 510-2 and negative trace 514 of first channel 510-1. As depicted in FIG. 5, both posts 522A, 522B of connector 522 of positive trace 512 are located in-line relative to positive trace 512 and both posts 524A, 524B of connector 524 of negative trace 514 are located in-line relative to negative trace 514. In these embodiments, crossover may occur in a breakout pattern comprising positive trace crossover 526 and negative trace crossover 528. Connectors 522 and 524 may comprise capacitors or resistors.

Dual Crossover Connector Package

Figure 6:
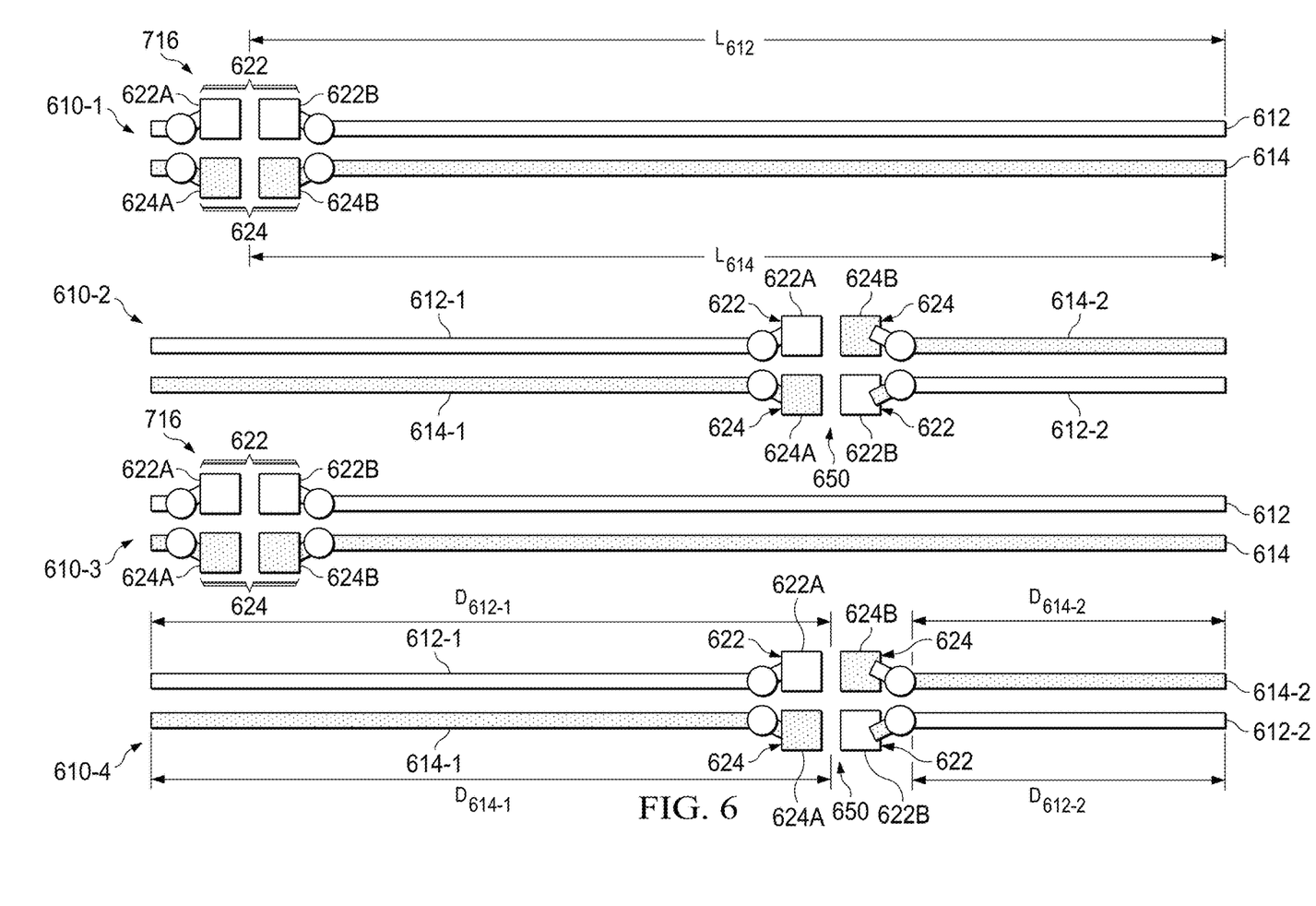
FIG. 6 depicts a layout of a plurality of channels according to one embodiment, illustrating a system for preventing crosstalk between adjacent traces using a capacitor crossover connector.

In some embodiments, crossover occurs at a capacitor crossover connector 650. Referring to FIG. 6, in some embodiments, second channel 610-2 may be configured with capacitive crossover connector 650 such that first post 622A of connector 622 is located in line with first portion 612-1 of positive trace 612, second post 622B is located in-line with second portion 612-2 of positive trace 612, first post 624A of connector 624 is located in line with first portion 614-1 of negative trace 614, and second post 624B is located in-line with second portion 614-2 of negative trace 614. In some embodiments, crossover connector 650 comprises a capacitor.

Figure 7:
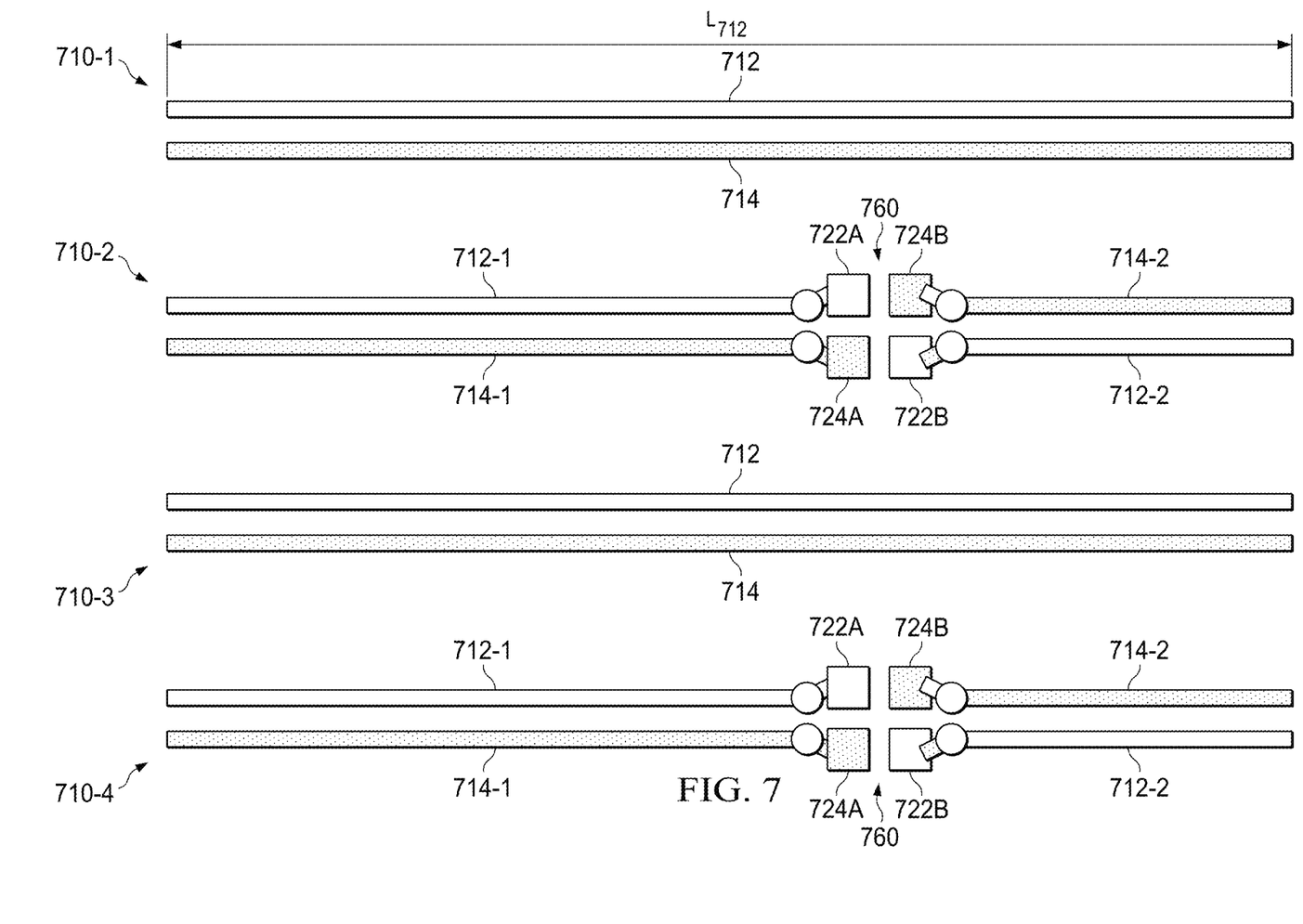
FIG. 7 depicts a layout of a plurality of channels according to one embodiment, illustrating a system for preventing crosstalk between adjacent traces using a resistor crossover connector.

Referring to FIG. 7, in some embodiments, crossover occurs at a resistor crossover connector 760. Referring to FIG. 7, in some embodiments, first channel 710-1 and third channel 710-3 do not have a connector along traces 712 or 714. Each of second channel 710-2 and 710-4 may be configured with zero ohm resistor crossover connector 760 such that first positive trace post 722A of connector 722 is located in line with first portion 712-1 of positive trace 712, second positive trace post 722B of connector 722 is located in-line with second portion 612-2 of positive trace 612, first negative trace post 624A of connector 724 is located in line with first portion 614-1 of negative trace 614, and second negative trace post 624B of connector 724 is located in-line with second portion 614-2 of negative trace 614.

Figure 8:
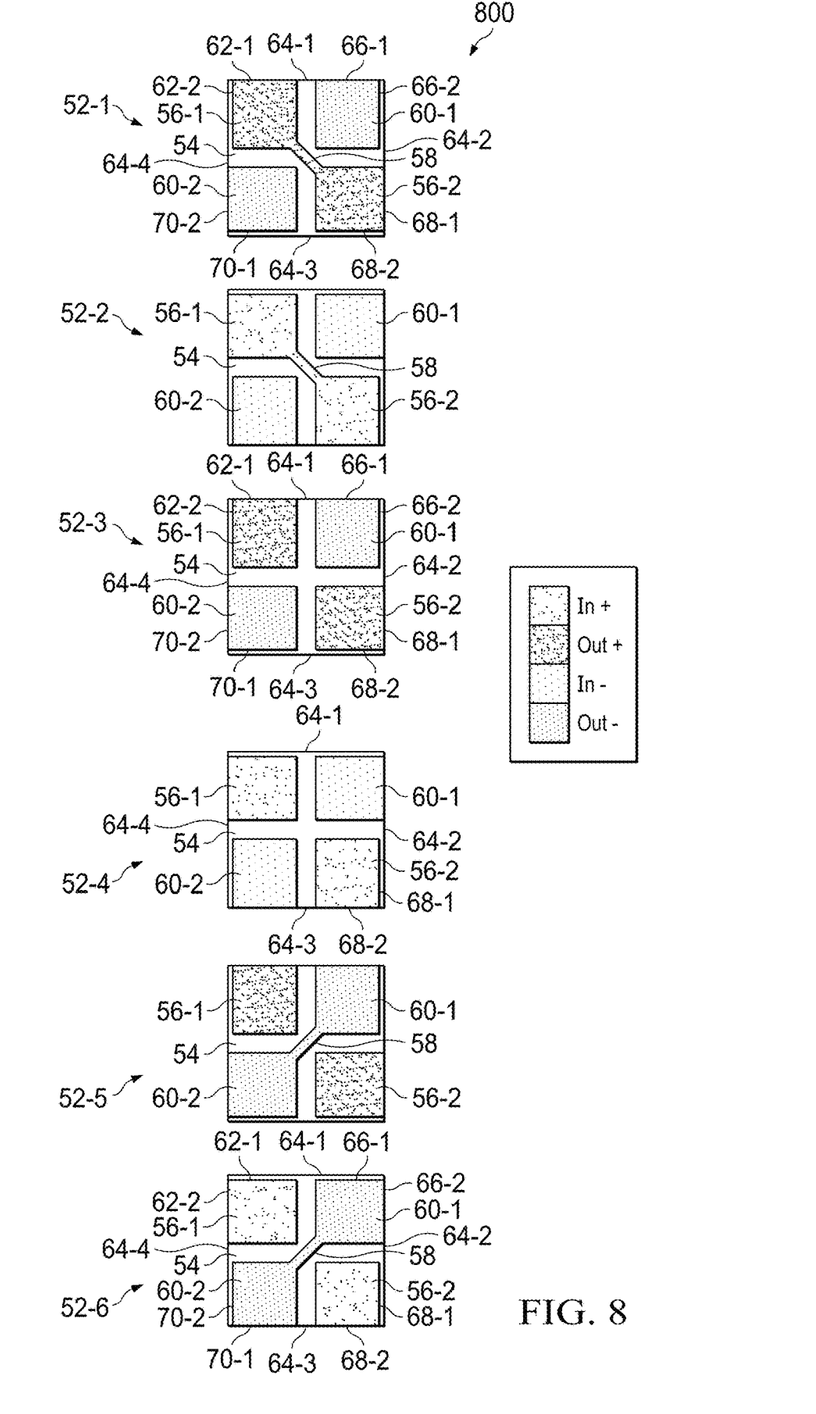
FIG. 8 is a top view of layers of a crossover connector package according to one embodiment of a system for preventing crosstalk between adjacent traces.

Referring to FIG. 8, a crossover connector 800 comprises a plurality of layers 52. FIG. 8 depicts six layers 52, but the invention is not limited such that the number of layers 52 may be based on providing a desired capacitance or resistance. As depicted in FIG. 8, each layer 52 comprises base 54 with two positive pads 56 and two negative pads 60. Base 54 may comprise nonconducting material, for example ceramic.

Some levels 52 comprise filament 58 connecting either the two positive pads 56 or the two negative pads 60.

Each of the Pads are Flush With or Recessed From the Sides of the Base

Referring to layer 52-1, at least one layer 52 comprises positive pad 56-1 configured with a first side (e.g., side 62-1) approximately flush relative to first edge 64-1 of base 54 and a second side (e.g. side 62-2) recessed from fourth edge 64-4 of base 54. Layer 52-1 further comprises positive pad 56-2 configured with a first side (e.g., side 68-1) approximately flush relative to second edge 64-2 of base 54 and a second side (e.g. side 68-2) recessed from third edge 64-3 of base 54. Layer 52-1 further comprises negative pad 60-1 configured with a first side (e.g., side 66-1) approximately flush relative to first edge 64-1 of base 54 and a second side (e.g. side 66-2) recessed from second edge 64-2 of base 54. Layer 52-1 further comprises negative pad 60-2 configured with a first side (e.g., side 70-1) recessed from third edge 64-3 of base 54 and second side (e.g. side 70-2) approximately flush relative to fourth edge 64-4 of base 54.

Thus, crossover connector 800 comprises a plurality of layers 52, wherein each layer 52 in crossover connector 800 comprises base 54 and two positive pads 56 and two negative pads 60, wherein at least one layer has a filament 58 between two positive pads 56, at least one layer 52 has a filament 58 between two negative pads 60, and at least one layer 52 has no filament between the two positive pads 56 or the two negative pads 60. Crossover connector 800 may comprise resistors or capacitors.

A first set (e.g., layer 52-1) of layers 52 comprise positive pads 56-1 having a first side 62-1 flush relative to a first edge 64-1 of base 54, a second side 62-2 recessed relative to a fourth edge 64-4 of base 54, positive pads 56-2 having a first side 68-1 flush relative to second edge 64-2 of base 54 and a second side 68-2 recessed relative to third edge 64-3 of base 54 and filament 58 connecting positive pads 56-1 and 56-2. The first set of layers 52 further comprise negative pads 60-1 having a first side 66-1 flush relative to first edge 64-1 of base 54, a second side 66-2 recessed relative to second edge 64-2 of base 54 and negative pads 60-2 having a first side 70-1 recessed relative to third edge 64-3 of base 54 and a second side 70-2 flush relative to fourth edge 64-4 of base 54.

A second set (e.g., layer 52-6) of layers 52 comprise positive pads 56-1 having a first side 62-1 recessed relative to first edge 64-1 of base 54, a second side 62-2 flush relative to a fourth edge 64-4 of base 54, positive pads 56-2 having a first side 68-1 recessed relative to second edge 64-2 of base 54 and a second side 68-2 flush relative to third edge 64-3 of base 54. The second set of layers 52 further comprise negative pads 60-1 having a first side 66-1 recessed relative to first edge 64-1 of base 54, a second side 66-2 flush relative to second edge 64-2 of base 54 and negative pads 60-2 having a first side 70-1 flush relative to third edge 64-3 of base 54 and a fourth side 70-2 recessed relative to fourth edge 64-4 of base 54 and filament 58 connecting negative pads 60-1 and 60-2.

A third set (e.g., layer 52-3) of layers 52 comprise positive pads 56-1 having a first side 62-1 flush relative to a first edge 64-1 of base 54, a second side 62-2 recessed relative to a fourth edge 64-4 of base 54, positive pads 56-2 having a first side 68-1 flush relative to second edge 64-2 of base 54 and a second side 68-2 recessed relative to third edge 64-3 of base 54. The third set of layers 52 further comprise negative pads 60-1 having a first side 66-1 flush relative to first edge 64-1 of base 54, a second side 66-2 recessed relative to a second edge 64-2 of base 54 and negative pads 60-2 having a first side 70-1 recessed relative to second edge 64-2 of base 54 and a second side 70-2 flush relative to fourth edge 64-4 of base 54. The third set of layers may not have filament 58 between positive pads 56 or negative pads 60.

A fourth set (e.g., layer 52-4) of layers 52 comprise positive pads 56-1 having a first side 62-1 recessed relative to first edge 64-1 of base 54, a second side 62-2 flush relative to a fourth edge 64-4 of base 54 and positive pads 56-2 having a first side 68-1 recessed relative to second edge 64-2 of base 54 and a second side 68-2 flush relative to third edge 64-3 of base 54. The fourth set of layers 52 further comprise negative pads 60-1 having a first side 66-1 recessed relative to first edge 64-1 of base 54, a second side 66-2 flush relative to a second edge 64-2 of base 54 and negative pads 60-2 having a first side 70-1 flush relative to third edge 64-3 of base 54 and a second side 70-2 recessed relative to fourth edge 64-4 of base 54. The fourth set of layers may not have filament 58 between positive pads 56 or negative pads 60.

Figure 9A:
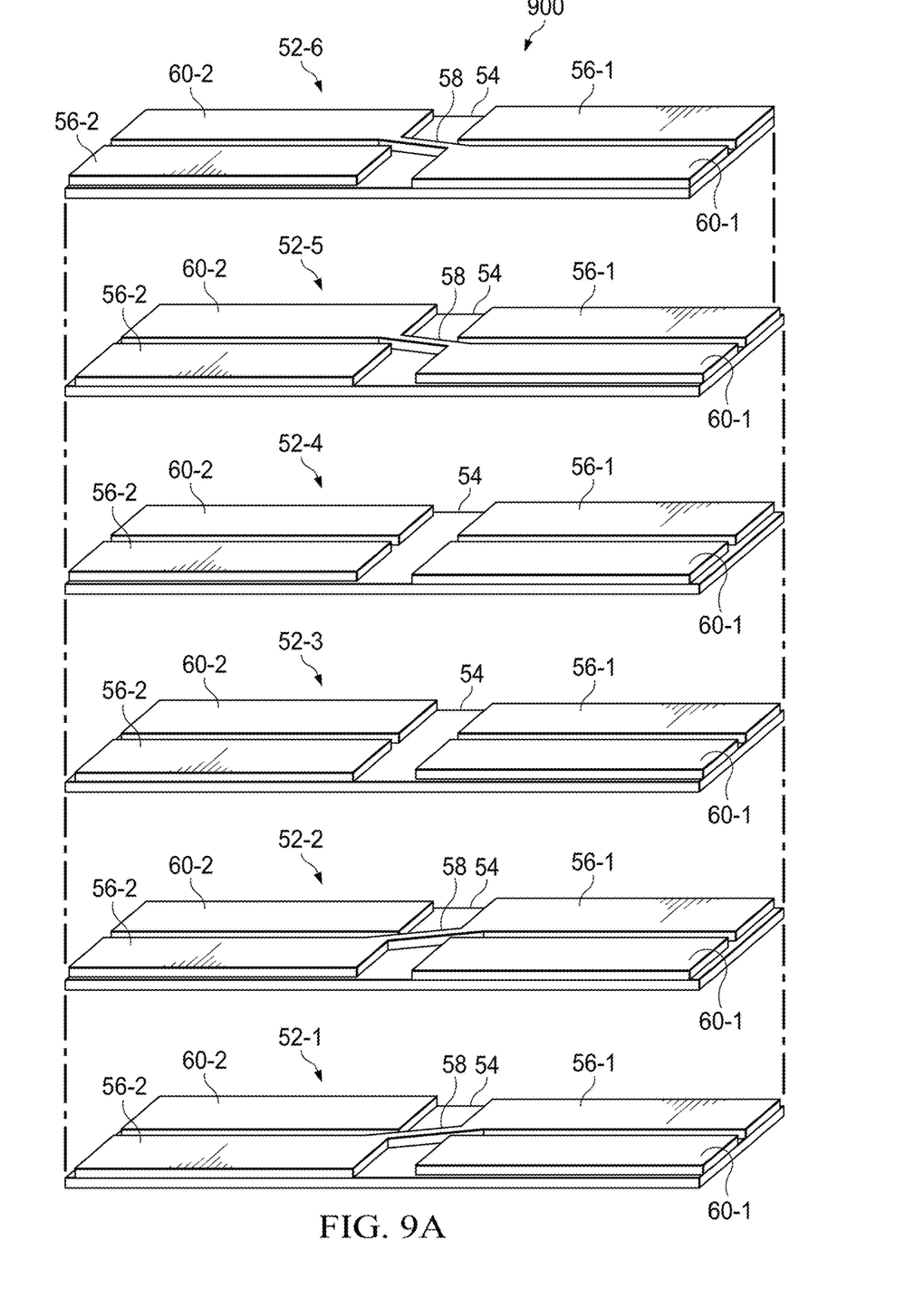
FIG. 9A is a perspective exploded view of layers of a crossover connector package according to one embodiment of a method for manufacturing a system for preventing crosstalk between adjacent traces.
Figure 9B:
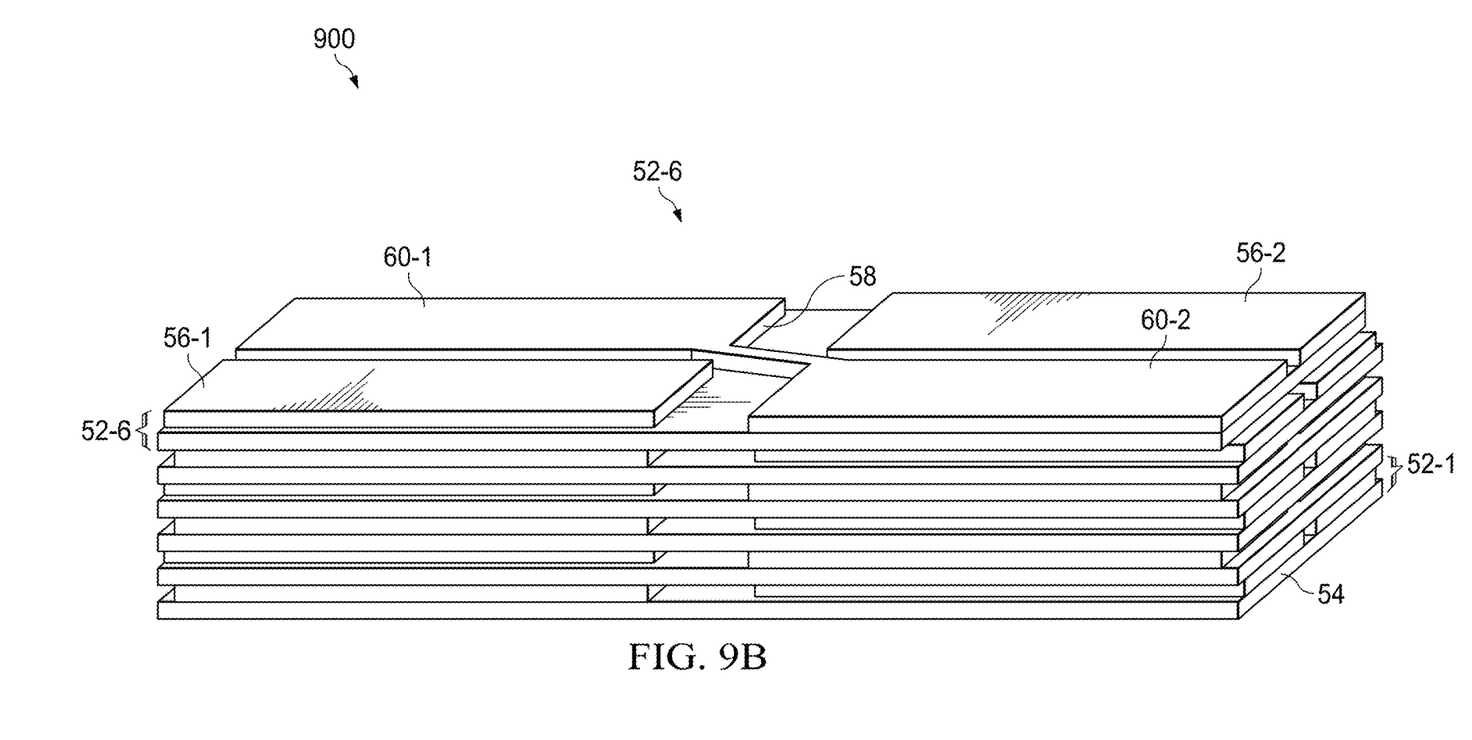
FIG. 9B is a perspective view of an assembled crossover connector package according to one embodiment of a method for manufacturing a system for preventing crosstalk between adjacent traces.

FIGS. 9A and 9B depict an exploded perspective view and an assembled perspective view, respectively, of a dual crossover connector package 900 for use as a crossover connection such as crossover connection 650 Or 760 as depicted in FIG. 6 or 7. FIGS. 9A and 9B depict a dual crossover connector package 900 comprising six layers 52. As visible in FIG. 9A, pads 56 and 60 may be positioned on layers 54 such that at least one side of each positive pad 56 is flush with a side of base 54 and at least one side is recessed relative to base 54 and at least one side of each negative pad 60 is flush with a side of base 54 and at least one side is recessed relative to base 54.

Connection Between Layers

Figure 10:
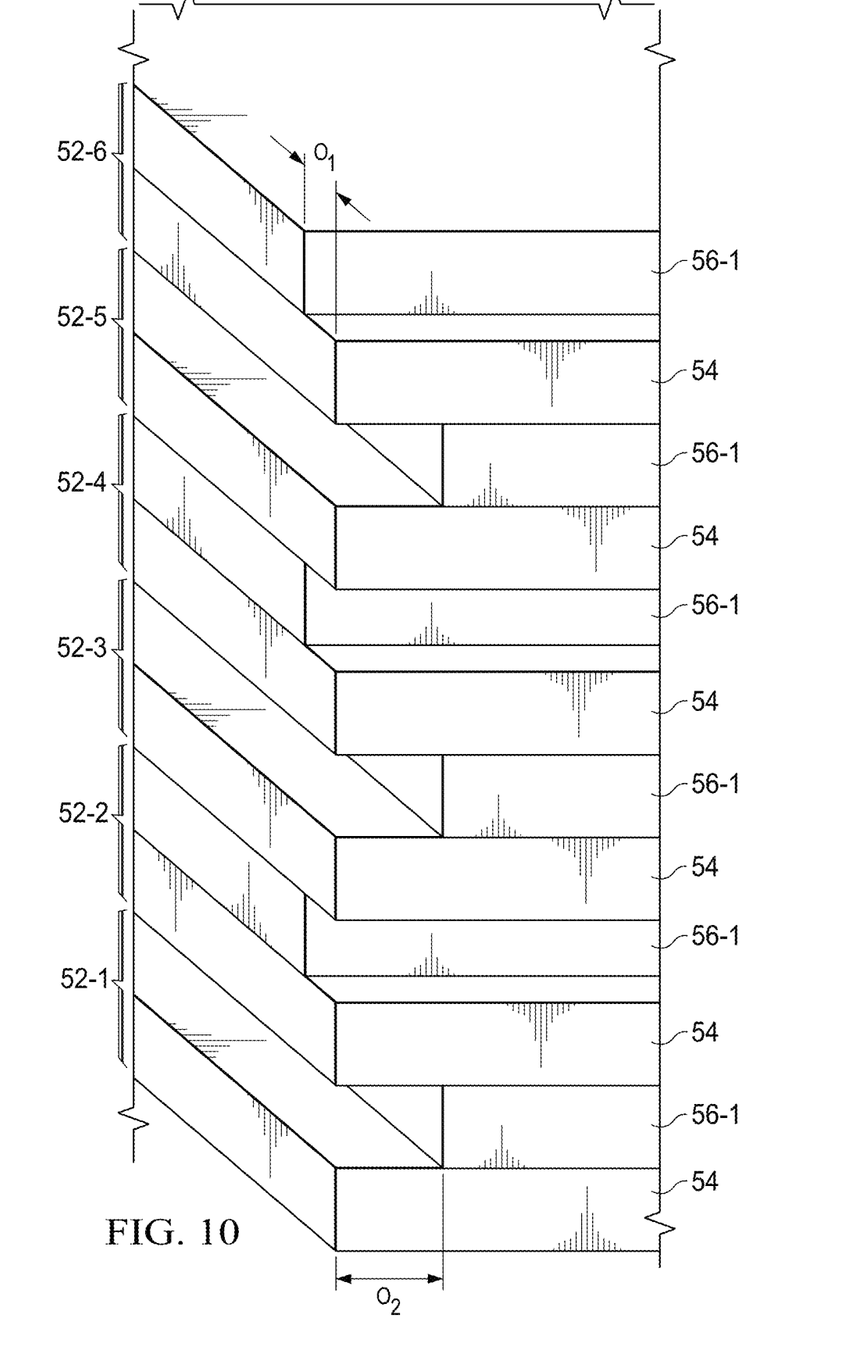
FIG. 10 is a close-up partial perspective view of layers of the crossover connector package of FIG. 9B according to one embodiment of a method for manufacturing a system for preventing crosstalk between adjacent traces.

Two or more positive pads 56 or negative pads 60 on multiple layers 52 may be connected. Referring to FIG. 10, a close-up partial perspective view of one embodiment of a dual crossover connector package 800 illustrates a first offset (O$_1$) between positive pads 56 relative to a first edge of base 54 and a second offset (O$_2$) between positive pads 56 relative to a second edge of base 54. In this configuration, a coupling on a first side may connect positive pads 56 corresponding to layers 52-1, 52-3 and 52-5 and a coupling on a second side may connect layers 52-2, 52-4 and 52-6 into a set of layers 52. As more positive pads 56 and negative pads 60 are connected, capacitance may increase, which may be more advantageous for preventing crosstalk between adjacent channels.

Figure 11:
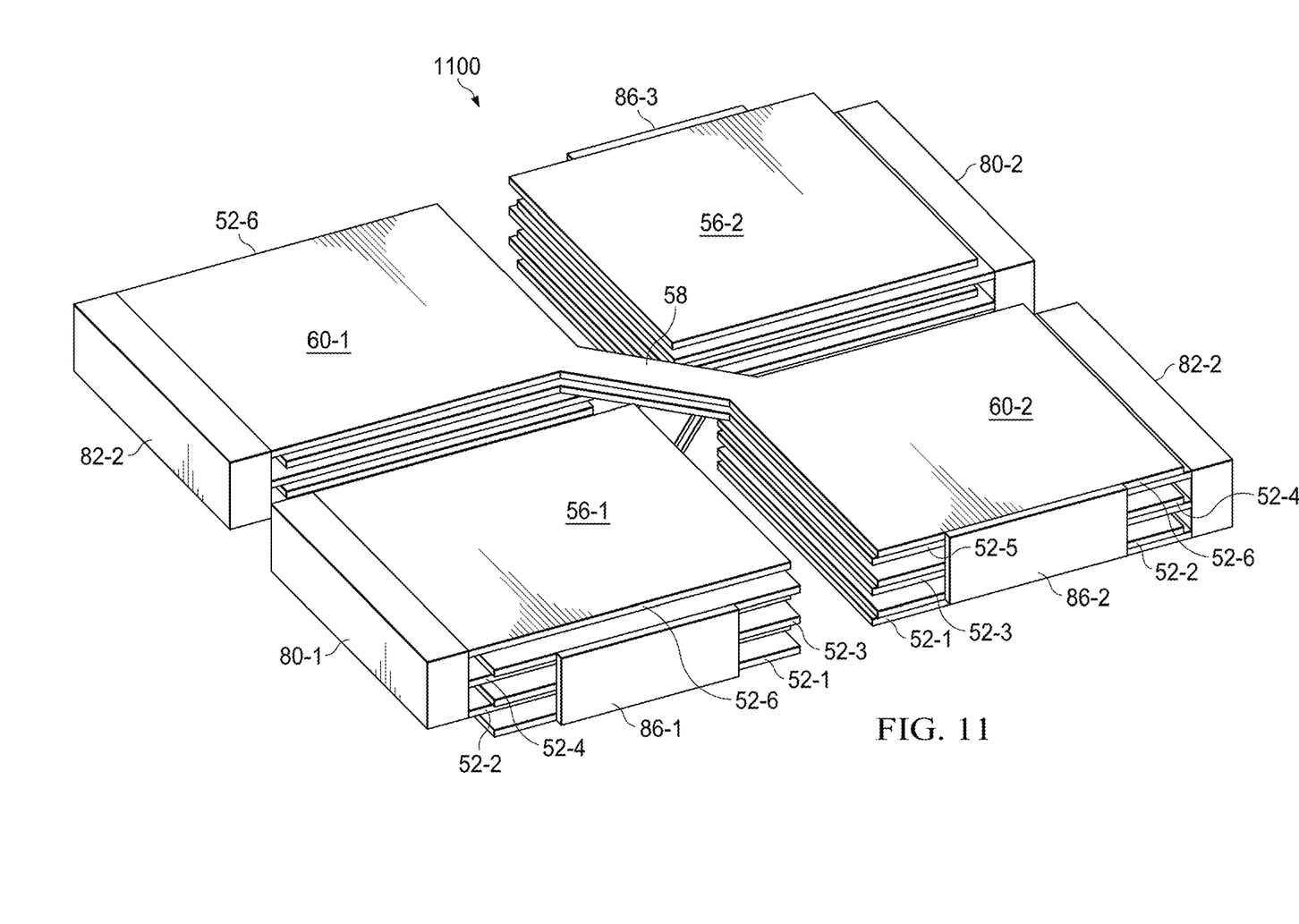
FIG. 11 is a perspective view of an assembled capacitor package with metallization applied to the layers according to one embodiment of a method for manufacturing a system for preventing crosstalk between adjacent traces.

Referring to FIG. 11, a close-up perspective view of one embodiment of a dual crossover connector package 1100 illustrates couplings that connect positive pads 56 or negative pads 60 of multiple layers 52. As depicted in FIG. 11, bases 54 are not fully depicted for clarity.

As depicted in FIG. 11, contacts 80-1 and 80-2 are coupled to positive pads 56 and contacts 82-1 and 82-2 are coupled to negative pads 60.

Contact 80-1 may be coupled to positive pads 56-1 on selected layers 52-2, 52-4 and 52-6 of a plurality of layers 52-1 to 52-6. Although not visible in FIG. 11, contact 80-2 may be coupled to positive pads 56-2 on selected layers 52-2, 52-4 and 52-6. Connector 86-1 may be coupled to positive pads 56 on layers 52-1, 52-3 and 52-5 of the plurality of layers 52-1 to 52-6. Connector 86-3 may be coupled to positive pads 56-2 on layers 52-1, 52-3 and 52-5 of the plurality of layers 52-1 to 52-6.

Although not visible in FIG. 11, contact 82-1 may be coupled to negative pads 60-1 on selected layers 52-2, 52-4 and 52-6 of a plurality of layers 52-1 to 52-6. Contact 82-2 may be coupled to negative pads 60-2 on selected layers 52-2, 52-4 and 52-6 of the plurality of layers 52-1 to 52-6. Connector 86-2 may be coupled to negative pads 60-2 on layers 52-2, 52-4 and 52-6 of the plurality of layers 52-1 to 52-6.

Figure 12:
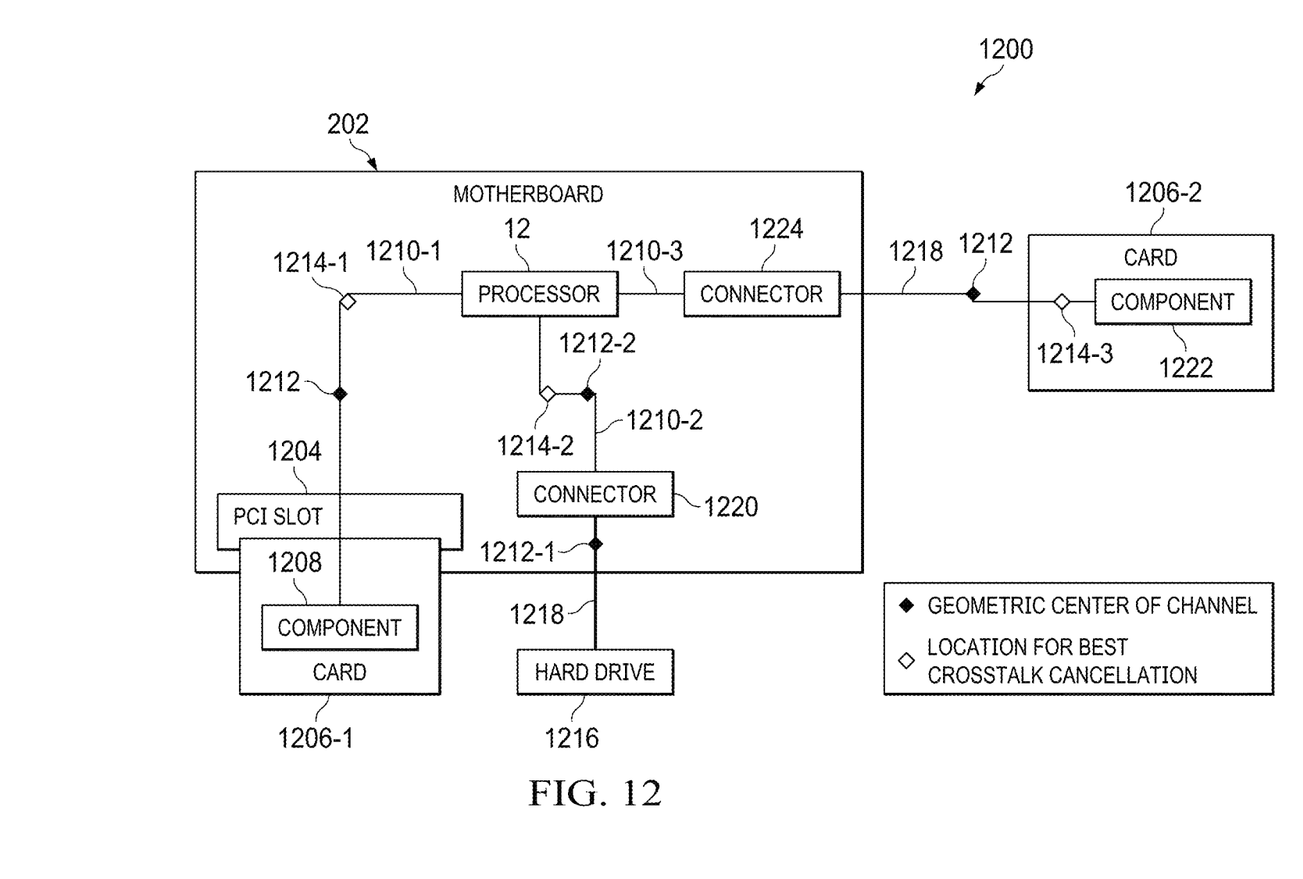
FIG. 12 is a block diagram illustrating selective placement of a system for preventing crosstalk in an information handling system.

Referring to FIG. 12, manufacturing an information handling system 100 with a system 1200 for preventing crosstalk may comprise identifying a channel 1210 in which crosstalk is possible and positioning a system for preventing crosstalk in the channel 1210.

As depicted in FIG. 12, channel 1210-1 connects processor 12 and component 1208 on card 1206-1. Card 1206-1 may be installed in PCI slot 1204. As depicted in FIG. 12, the geometric center 1212 of channel 1210-1 is at a first location on motherboard 202. However, a system for preventing crosstalk may be more effective if a crossover connector such as connector 650 or 750 is located at point 1214-1, which is closer to processor 12.

Also depicted in FIG. 12, channel 1210-2 connects processor 12 to hard drive 1216 using cable 1218 between connector 1220 and hard drive 1216. Cable 1218 may have very low losses such that between processor 12 and hard drive 1216, only a channel portion 1210-2 may have losses. As depicted in FIG. 12, geometric center 1212-1 may be the actual geometric center between processor of processor 12 and hard drive 1216, but geometric center 1212-2 may be the geometric center of channel 1210-2 associated with losses. Accordingly, a system for preventing crosstalk may be located at point 1214-2 on motherboard 202 between processor 12 and cable connector 1220.

Also depicted in FIG. 12, channel 1210-3 connects processor 12 and component 1222 on card 1206-2, which is connected to motherboard 202 using cable 1218 connected to cable connector 1224. Cable 1218 may have losses such that between processor 12 and component 1222, geometric center 1212 of channel 1210-3 is located along cable 1218. Accordingly, a system for preventing crosstalk may be located at point 1214-3 on card 1206-2 closer to component 1222.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A system for preventing crosstalk between two adjacent channels, the system comprising:
 a first channel having a first channel length, the first channel comprising:
  a first positive trace having a first positive trace length;
  a first negative trace having a first negative trace length; and
 a connector positioned at a first location along the first positive trace length, wherein the first positive trace is on a first side of the first negative trace;
 a second channel having a second channel length, the second channel comprising:
  a second positive trace comprising a first positive trace portion having a first positive trace portion length and a second positive trace portion having a second positive trace portion length;
  a second negative trace comprising a first negative trace portion having a first negative trace portion length and a second negative trace portion having a second negative trace portion length; and a crossover connector comprising a positive trace crossover and a negative trace crossover, the crossover connector is located on a card and positioned a distance from a source, wherein:
    the first positive trace portion of the second positive trace is on the first side of the first negative trace portion of the second negative trace and is coupled to a first positive trace post of the crossover connector, wherein the first negative trace portion of the second negative trace is coupled to a first negative trace post of the crossover connector;
    the second positive trace portion of the second positive trace is on the second side of the second negative trace portion of the second negative trace and is coupled to a second positive trace post in the crossover connector, wherein the second negative trace portion of the second negative trace is coupled to a second negative trace post,
the crossover connector further comprising:
    a plurality of layers, wherein each layer comprises two positive post pads and two negative post pads, wherein
        at least one layer comprises a filament between the two positive pads;
        at least one layer comprises a filament between the two negative pads; and
        at least one layer does not have a filament between the two positive pads or the two negative pads.

2. The system of claim 1, wherein the crossover connector comprises a resistor.

3. The system of claim 1, wherein the crossover connector comprises a capacitor.

\* \* \* \* \*